United States Patent [19]
Steininger et al.

[11] Patent Number: 5,585,139
[45] Date of Patent: Dec. 17, 1996

[54] MAGNETIC RECORDING MEDIUM AND THE PRODUCTION THEREOF

[75] Inventors: Helmut Steininger, Worms; Peter Heilmann, Bad Dürkheim, both of Germany

[73] Assignee: BASF Magnetics GmbH, Mannheim, Germany

[21] Appl. No.: 355,300

[22] Filed: Dec. 12, 1994

[30] Foreign Application Priority Data

Dec. 16, 1993 [DE] Germany .................. 43 42 929.7

[51] Int. Cl.$^6$ ........................................ G11B 5/85
[52] U.S. Cl. .................... 427/128; 427/129; 427/130; 427/251; 427/255.5; 427/548; 427/576; 427/599; 204/192.2
[58] Field of Search ............... 428/457, 694 T, 428/694 TP; 427/128, 129, 130, 251, 255.5, 548, 576, 599; 204/192.2

[56] References Cited

U.S. PATENT DOCUMENTS

| | | | |
|---|---|---|---|
| 4,645,690 | 2/1987 | Murakami et al. | 427/128 |
| 4,663,193 | 5/1987 | Endo et al. | 427/129 |
| 4,743,348 | 5/1988 | Ando et al. | 204/192.2 |
| 4,846,948 | 7/1989 | Saito et al. | 204/192.2 |
| 4,888,211 | 12/1989 | Oka et al. | 427/130 |
| 5,073,449 | 12/1991 | Niimi et al. | 428/336 |
| 5,290,590 | 3/1994 | Richter et al. | 427/128 |
| 5,352,501 | 10/1994 | Miyamoto et al. | 428/64 |

*Primary Examiner*—Stevan A. Resan
*Attorney, Agent, or Firm*—Keil & Weinkauf

[57] ABSTRACT

The magnetic recording medium consists essentially of a polymeric substrate, a coherent, magnetic thin metal film applied to the surface of the substrate by a PVD method and, if required, a protective layer formed on the thin metal film. In order to achieve a large residual induction component in the plane of the film, in particular high residual induction in the transverse direction, the thin metal film contains a noble gas or noble gas mixture, preferably argon. During the coating of the polymeric substrate with the magnetic metal or with the magnetic alloy, the noble gas is fed directly and preferably tangentially to the substrate surface at a specific noble gas flow of from $1.0 \cdot 10^4$ to $6.0 \cdot 10^4$. In the plane of the thin metal film, the ratio of residual induction in the longitudinal direction to that in the transverse direction is from about 0.9 to about 1.8.

5 Claims, 1 Drawing Sheet

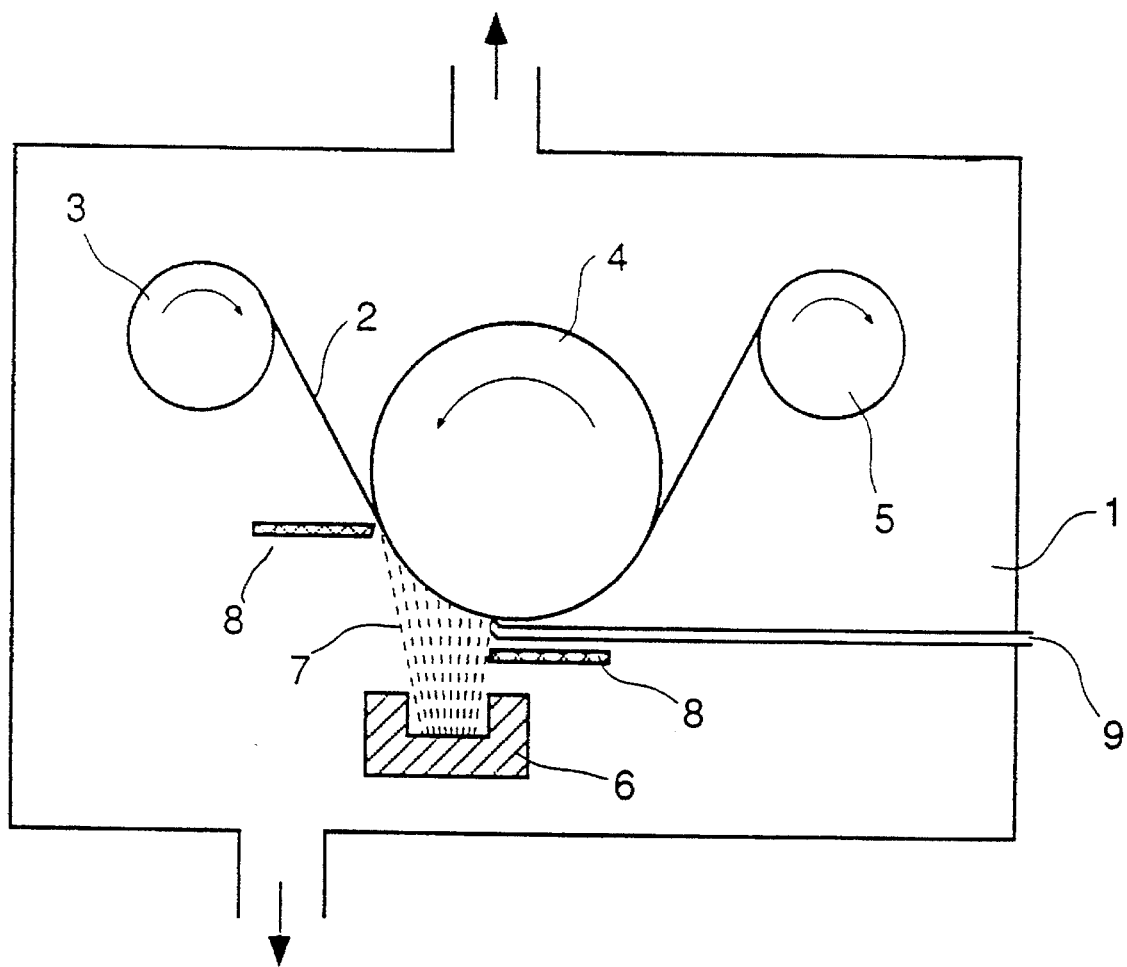

MAGNETIC RECORDING MEDIUM AND THE PRODUCTION THEREOF

BACKGROUND OF THE INVENTION

Field of the Invention

The present invention relates to a magnetic recording medium, essentially consisting of a polymeric substrate and at least one coherent, magnetic thin metal film which is present on the surface of the substrate and is deposited in the PVD process on the polymeric substrate moved longitudinally past an evaporation crucible, and a process for the production of the magnetic recording medium, in which a vapor jet obtained by evaporating a magnetic metal or a magnetic alloy is deposited in the form of a coherent, magnetic thin metal film on a longitudinally moving polymeric substrate, The application of thin metal films to polymeric substrates is of interest particularly in the production of magnetic recording media. Compared with the conventional particulate magnetic media, coherent thin magnetic films permit recording with higher storage densities. This is due on the one hand to the small layer thickness of only from 20 to 1000 nm and the associated low demagnetization effect and on the other hand to the relatively large number of elementary magnets per unit volume and the resulting higher magnetization. Whereas in the case of the particulate recording media longitudinal recording by means of magnetic particles oriented along the tape playing direction is usual, oblique orientation of the elementary magnets in the coherent metal film, adapted to the field lines in front of the head, is desirable in the case of the thin magnetic films having a high storage density. By oblique deposition of the ferromagnetic material on the substrate, it is possible to achieve substantially improved recording properties, as described, inter alia, in U.S. Pat. No. 3,342,632 U.S. Pat. No. 4,323,629 with regard to the Co-Ni-O films or by R. Sugita et al., Digest Intermag 1990, Article FA-08, with regard to the Co-Cr films. The particular desired angular range, which decisively influences the properties of the applied magnetic layer, is obtained in the vapor deposition or sputtering of the magnetic material by correspondingly arranged evaporator sources or sputter cathodes and screens.

It is known that the thin metal film can be formed in the presence of oxygen in order to improve the adhesion of the metal film to the substrate and also to ensure sufficient mechanical stability, in particular of the surface layers of the metallic magnetic film (DE-A-32 41 775). However, it has been found that even small amounts of oxygen lead to a reduction in the residual induction and to an increase in the coercive force, which may be very undesirable.

It is an object of the present invention to provide a magnetic recording medium having a large residual induction component in the plane of the film and in particular high residual induction in the transverse direction, i.e. perpendicular to the playing direction of the film, the coercive force being >10 kA/m, and a process which permits the production of such recording media having constant quality.

SUMMARY OF THE INVENTION

We have found that this object is achieved satisfactorily and that at the same time, in the plane of the magnetic thin metal film, the ratio of residual induction in the longitudinal direction to that in the transverse direction is from 0.9 to 1.8, if, during the coating of the polymeric substrate with the magnetic metal or with the magnetic alloy, a noble gas stream is pointed directly at the substrate surface, the specific noble gas flow being $1.0 \ldots 6.0 \cdot 10^4$, and if the resulting thin metal film contains a noble gas or noble gas mixture which preferably consists of argon.

BRIEF DESCRIPTION OF THE DRAWING

The FIGURE shows an apparatus comprising a vacuum chamber (1), substrate film (2), feed roller (3), coating roller (4), rewind roller (5), evaporator unit (6), screens (8) and (8'), and pipeline (9).

DESCRIPTION OF THE PREFERRED EMBODIMENTS

According to the invention, the magnetic thin metal film contains a noble gas, and the ratio of the noble gas atoms to the atoms of the magnetic metal in the nascent state may be from about 1/1000 to about 1/100. We have found that, with increasing noble gas content, the magnetic properties of a recording medium can be influenced in the longitudinal and transverse directions, i.e. the magnetization in the transverse direction steadily increases and that in the longitudinal direction simultaneously decreases, which is presumably due to the fact that noble gases interfere with the formation of a regular morphology. In particular, it is possible to obtain large transverse components of the magnetization and to achieve magnetically isotropic or substantially isotropic thin metal films having a ratio of longitudinal to transverse residual induction of from about 0.9 to about 1.8 on a polymeric substrate. The coercive force is from about 10 to 40 kA/m. Examples of suitable noble gases are helium, neon and, for economic reasons, argon and mixtures of these gases.

The polymeric substrates suitable for the magnetic recording medium according to the invention are known. They are preferably polyethylene terephthalate (PET), polyimide (PI), polyethylene naphthalate (PEN), polyamide (PA), polyether ether ketone (PEEK), polysulfone (PS), polyether sulfone (PESU), polyphenylene sulfide (PPS) and thermotropic liquid crystalline polymers (LCP), in particular PET and PI substrates being used as substrates for recording media having a thin metal film. For example, in order to influence the adhesion, the substrate surface to be coated may be coated and/or metallized over its entire surface or in parts with a coating which may also be particle-filled.

The coherent magnetic thin metal film is then applied to such a substrate by a known procedure. Suitable metal films are in general cobalt-containing, for example Co-Ni-Cr, Co-Pt, Co-Ni-O or Co-Cr. Cobalt-chromium films containing from 15 to 35 atom % of chromium, cobalt-nickel films containing more than 10 atom % of nickel or cobalt-nickel-oxygen films containing more than 10 atom % of nickel, and from 3 to 45 atom % of oxygen are preferred. However, corresponding thin metal films based on iron are also suitable. These films are produced with the aid of a PVD method, for example by evaporation, electron beam evaporation, sputtering or ion plating. Vapor deposition and sputtering are preferred. The magnetic metal films produced in this manner may comprise a single thin film or two or more films and are from 20 to 500 nm thick. In the case of lower films, film thicknesses of from 2 to 500 nm are preferred. Suitable lower films are those comprising chromium, titanium, aluminum, germanium, silicon, tungsten, platinum or permalloy.

In order to improve the abrasion resistance and corrosion resistance of the thin metal film, it may be advantageous to provide said film with a protective layer having a thickness of from 1 to 100 nm. The application of a carbon layer, surface oxidation of the metal film, coating with liquid oligomers generally based on fluorine-containing polyethers, the formation of oxides, nitrides or carbides of aluminum, of silicon, of zirconium, of hafnium and of titanium and alloys of these elements or a combination of these measures are known here. Other suitable protective layers are about 0.5–3 μm thick surface coatings comprising polymers, for example polysiloxanes, polyesters, polyurethanes, epoxies, polyacrylates or mixtures of these polymers.

For the production of the magnetic recording media according to the invention, a vapor jet obtained by evaporating a magnetic metal or a magnetic alloy is deposited in the form of a thin metal film on a moving polymeric substrate. In the formation of the thin metal film, a large residual induction component can be produced in the plane of the film in a simple manner by directing a noble gas stream directly at the substrate surface and over the total width of the substrate to be coated. A total specific noble gas flow of from about $1.0 \cdot 10^4$ to $6.0 \cdot 10^4$ has proved particularly advantageous, the specific noble gas flow being determined by $Q/(v \cdot b \cdot d)$ where Q is the flow rate of the noble gas (unit: $m^3$/minute), v is the coating velocity (transport velocity of the substrate, unit: m/minute), d is the thickness of the thin metal film and b is the width of the thin metal film (unit in each case: m). The novel process is distinguished in particular by easy control and monitoring of the content of noble gas atoms in the thin metal film. For this purpose, it is generally sufficient to feed the noble gas into the process space in an appropriate dose.

For very high noble gas contents in the thin metal film, i.e. for a particularly effective utilization of the noble gas passed into the process space with regard to the ratio of the residual induction in the longitudinal direction to that in the transverse direction, it is possible, in an advantageous embodiment of the process, to direct the noble gas stream at least roughly tangentially at the substrate surface.

It is also possible homogeneously to distribute from 2 to 50% by volume of process gases, e.g. $H_2$, $N_2$, $O_2$ or synthetic air, in the noble gas stream pointed directly at the substrate surface, with the result that in particular the magnetic homogeneity of the thin metal film in the transverse direction can be improved.

According to a further feature of the present invention, the polymeric substrate is passed, while it is being coated, over a heatable and coolable coating roller, the temperature of the coating roller being typically from $-30°$ C. to $400°$ C., depending on the substrate material used and on the process conditions, and being chosen very high within this range. To obtain good mechanical strength, the temperature of the polymeric substrate should not exceed the glass transition temperature, e.g. $T_g$ for PET$\approx 82°$ C. The level of the maximum settable coating roller temperature thus depends on the heat stability of the substrate to be coated and on the chosen coating conditions, such as transport velocity of the substrate and coating rate (power of the electron beam source or of the sputtering source), which, in addition to the coating roller temperature, are critical for the substrate temperature established during coating. This may be effected, for example, by passing a liquid heating medium through the coating roller mounted in the process space. We have found that, as the substrate is increasingly heated during application of the thin metal film by vapor deposition, the residual induction $M_r$ in the plane of the film increases in the transverse direction. This makes it possible to produce coherent thin metal films at a predetermined transverse residual flux $\Phi_r = M_r \cdot d$ with reduced film thickness d.

The invention is illustrated by the examples below, with reference to the drawing.

EXAMPLE 1

A 20 nm thick $Co_{80}Ni_{20}$ film was applied by vapor deposition to a 10 μm thick polyethylene terephthalate film in an apparatus as shown schematically in the drawing. The apparatus comprises essentially a vacuum chamber (1) in which the polyethylene terephthalate film (2), was fed from the storage roller (3) via the coating roller (4) to the rewind roller (5), and, below the coating roller (4) and slightly to one side, an evaporator unit (6) containing the magnetic coating material Co and Ni, whose vapor jet (7) was limited by the screens (8) and (8') and struck the film (2) at an angle of incidence of max. 90° to min. 30° and condensed on said film. Coating was effected in each case at a velocity of 17 m/min from left to right and with a specific argon flow of $3.7 \cdot 10^4$ (sample B) and from right to left and with a specific argon flow of $2.8 \cdot 10^4$ (sample C). The argon was fed to the film surface roughly tangentially via the pipeline (9). The temperature of the coating roller (4) was $-25°$ C. The magnetic properties of the $Co_{80}Ni_{20}$ film were determined using a vibrating sample magnetometer and are shown in the table below.

| Sample | Noble gas specific flow | Coercive force $H_c$ [kA/m] long. | trans. | Residual induction $M_r$ [kA/m] long. | trans. | $\dfrac{M_{r, long}}{M_{r, trans}}$ |
|---|---|---|---|---|---|---|
| A | 0 | 23 | 15 | 695 | 353 | ⁻2.0 |
| B | $3.7 \cdot 10^4$ | 30 | 27 | 499 | 494 | ⁻1.0 |
| C | $2.8 \cdot 10^4$ | 27 | 25 | 575 | 596 | ⁻1.0 |

The vapor deposition of the $Co_{80}Ni_{20}$ film in the presence of argon resulted in a recording medium having uniform residual induction in the longitudinal and transverse directions. The residual induction of the recording medium according to C was higher in absolute terms.

EXAMPLE 2

$Co_{80}Ni_{20}$ films were applied to a 10 μm thick polyethylene terephthalate substrate by vapor deposition as in Example 1, a gas stream comprising argon and synthetic air in a ratio of 12:1 being pointed directly at the substrate surface. The specific argon flow was $3.3 \cdot 10^4$. The synthetic air had an advantageous effect on the switching field distribution (SFD) in the transverse direction.

| Synthetic air specific flow | SFD transverse | SFD longitudinal |
|---|---|---|
| 0 | 0.33 | 0.19 |
| $0.28 \cdot 10^4$ | 0.19 | 0.29 |

We claim:

1. A process for the production of a magnetic recording medium, in which a vapor stream obtained by evaporating a magnetic metal or a magnetic alloy is deposited in the form of a coherent, magnetic metal thin film on a longitudinally moving curved polymeric substrate, wherein, in the plane of the magnetic metal thin metal film, the ratio of residual induction in the longitudinal direction to that in the transverse direction is from 0.9 to 1.8, and, during the coating of the polymeric substrate with the magnetic metal or with the magnetic alloy, a noble gas stream is pointed directly at the substrate surface, the specific noble gas flow, i.e. the ratio $$\frac{\text{(Flow of the noble gas) /Minute}}{\text{(Volume of the thin metal film deposited) /Minute}} = 1.0 \cdot 10^4 \text{ to } 6.0 \cdot 10^4$$

2. A process as defined in claim 1, wherein the noble gas stream is fed at least roughly tangentially to the substrate surface.

3. A process as defined in claim 1, wherein the noble gas stream contains from 2 to 50% by volume of homogeneously distributed process gases.

4. A process as defined in claim 1, wherein the polymeric substrate is passed over a heatable and coolable coating roller while being coated with the magnetic metal or with the magnetic alloy, the temperature of the coating roller, limited by the heat stability of the polymeric substrate, is selected from the temperature range of from −30° C. to 400° C.

5. A process as defined in claim 1, wherein the noble gas consists of argon.

* * * * *